(12) United States Patent
Cheng et al.

(10) Patent No.: US 11,069,586 B2
(45) Date of Patent: Jul. 20, 2021

(54) CHIP-ON-FILM PACKAGE

(71) Applicant: Novatek Microelectronics Corp., Hsinchu (TW)

(72) Inventors: Jhih-Siou Cheng, New Taipei (TW); Chun-Yung Cho, Hsinchu County (TW); Po-Yu Tseng, Taoyuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/968,929

(22) Filed: Dec. 15, 2015

(65) Prior Publication Data

US 2017/0092572 A1 Mar. 30, 2017

(30) Foreign Application Priority Data

Sep. 24, 2015 (TW) .................................. 10413159.3

(51) Int. Cl.
*H01L 23/495* (2006.01)
*H01L 21/66* (2006.01)
*H01L 23/498* (2006.01)

(52) U.S. Cl.
CPC .......... *H01L 22/32* (2013.01); *H01L 23/4985* (2013.01); *H01L 23/49838* (2013.01)

(58) Field of Classification Search
None
See application file for complete search history.

(56) References Cited

U.S. PATENT DOCUMENTS

| 5,545,920 A | * | 8/1996 | Russell | ............... H01L 23/4951 |
| | | | | 257/666 |
| 8,310,068 B2 | * | 11/2012 | Sasaki | ................. H01L 23/4985 |
| | | | | 257/786 |

(Continued)

FOREIGN PATENT DOCUMENTS

| CN | 101533820 | 9/2009 |
| CN | 102692740 | 9/2012 |

(Continued)

OTHER PUBLICATIONS

"Office Action of Taiwan Counterpart Application" dated Sep. 22, 2016, p. 1-p. 5.

(Continued)

*Primary Examiner* — Abul Kalam
(74) *Attorney, Agent, or Firm* — JCIPRNET

(57) ABSTRACT

A chip-on-film package including a flexible substrate, first test pads, second test pads, first connecting wires, second connecting wires and a chip is provided. The flexible substrate includes at least one segment. Each segment has a central portion and a first side portion and a second side portion located at two opposite sides of the central portion. The chip disposed on the central portion includes first connecting pads and second connecting pads. The first test pads and the second test pads are disposed on the first side portion. Two ends of each of the first connecting wires are connected to the corresponding first connecting pad and the corresponding first test pad. Two ends of each of the second connecting wires are connected to the corresponding second connecting pad and the corresponding second test pad. Each of the second connecting wires includes a first section located at the second side portion.

9 Claims, 6 Drawing Sheets

(56) References Cited

U.S. PATENT DOCUMENTS

| | | | |
|---|---|---|---|
| 8,952,934 B2 | 2/2015 | Hsieh et al. | |
| 9,048,243 B2 | 6/2015 | Cheng et al. | |
| 9,245,857 B2 | 1/2016 | Cheng et al. | |
| 2005/0113648 A1* | 5/2005 | Yang | A61B 5/0002 600/300 |
| 2006/0113648 A1* | 6/2006 | Chung | H01L 23/4985 257/678 |
| 2006/0181299 A1* | 8/2006 | Hirae | H01L 22/32 324/762.04 |
| 2009/0050887 A1 | 2/2009 | Kim et al. | |
| 2009/0322362 A1* | 12/2009 | Lim | G01R 31/2884 324/762.06 |
| 2013/0135462 A1 | 5/2013 | Chen et al. | |
| 2014/0004725 A1 | 1/2014 | Cheng et al. | |
| 2014/0084430 A1* | 3/2014 | Cho | H01L 23/4985 257/668 |
| 2014/0132566 A1 | 5/2014 | Hsieh et al. | |
| 2015/0253897 A1* | 9/2015 | Liang | G06F 1/16 345/174 |
| 2015/0262943 A1 | 9/2015 | Cheng et al. | |

FOREIGN PATENT DOCUMENTS

| | | |
|---|---|---|
| CN | 103135855 | 6/2013 |
| CN | 103187385 | 7/2013 |
| CN | 103809817 | 5/2014 |
| CN | 103915416 | 7/2014 |
| JP | 2008244069 | 10/2008 |
| TW | 201401448 | 1/2014 |

OTHER PUBLICATIONS

Office Action of China Counterpart Application, dated Jun. 20, 2018, pp. 1-5.

Garry Berkovic et al., "Optical methods for distance and displacement measurements", Advances in Optics and Photonics, vol. 4, Issue 4, 2012, pp. 441-471.

Office Action of China Counterpart Application, dated Sep 29, 2018, pp. 1-8.

\* cited by examiner

CHIP-ON-FILM PACKAGE

CROSS-REFERENCE TO RELATED APPLICATION

This application claims the priority benefit of Taiwan application serial no. 104131593, filed on Sep. 24, 2015. The entirety of the above-mentioned patent application is hereby incorporated by reference herein and made a part of this specification.

BACKGROUND OF THE INVENTION

Field of the Invention

The present invention relates to a chip package structure, and specifically relates to a chip-on-film package.

Description of Related Art

Ever-advancing wafer fabrication technology has led to rapid development of integrated circuit (IC) industry. ICs are fabricated to have lighter weight, smaller size, more complex and versatile functions, higher pin count, and higher frequency, and ICs are more diversified. In this development trend, Chip-on-film (COF) package satisfies the packing requirements of the ICs fabricated. The COF package can have a fine pitch and good flexibility, so that the COF package has a good performance in size stability, high circuitry density, flame resistance, and environment protection, etc.

Along with the change in design requirements of the product, the length of film used in the COF package is gradually increased, thus, the probe area of the test apparatus where COF packages are placed and tested is unable to accommodate more COF packages at the same time. Therefore, the time required for testing is increased, and the cost in testing is also increased accordingly. Besides, after the length of film is increased, it becomes more difficult for the probe cards of the test apparatus to simultaneously and precisely contact with the test pads located at edges of film, so as to result in a lower yield rate of test. If the cost in testing process cannot be reduced, the cost in production will be seriously affected, and therefore, it is not easy to obtain the advantage to compete in the market.

SUMMARY OF THE INVENTION

The invention provides a chip-on-film package which can resolve a problem that the cost in testing is too high.

The chip-on-film package of the invention includes a flexible substrate, a plurality of first test pads, a plurality of second test pads, a plurality of first connecting wires, a plurality of second connecting wires, and a chip. The flexible substrate has at least one central portion, at least one first side portion, and at least one second side portion. The first side portion and the second side portion are located at two opposite sides of the central portion respectively. The chip is disposed on the central portion and comprises a plurality of first connecting pads and a plurality of second connecting pads disposed on the central portion for bonding to the flexible substrate. The first test pads and the second test pads are disposed on the first side portion. Two ends of each of the first connecting wires are connected to the corresponding first connecting pad and the corresponding first test pad. Two ends of each of the second connecting wires are respectively connected to the corresponding second connecting pad and the corresponding second test pad, and each of the second connecting wires comprises a first section located at the second side portion.

Based on the above, all test pads of the chip-on-film package of the invention are located at the first side portion, therefore, all test pads of at least two chip-on-film packages are simultaneously accommodated in the probe area of the test apparatus, and the rate of successful bonding simultaneously all test pads and the probe card of the test apparatus is increased.

In order to make the aforementioned and other features and advantages of the invention more comprehensible, embodiments accompanying figures are described in detail below.

DESCRIPTION OF THE EMBODIMENTS

In a conventional COF package process, metal bumps are formed in advance on the bond pads of the chip for bonding the chip to the leads distributed on the flexible substrate. Alternatively, a bonding process without bumps is provided. The leads are conductive wires for transmitting electric signals. One of two ends of the lead for bonding to the chip is called an inner lead, and another one of the two ends of the lead for bonding to the display panel is called an outer lead. The main technical features of the invention does not aims on chip bumping process and the flexible substrate process which are not detailed described and are well known for the one having ordinary knowledge in the art.

Figure 1:
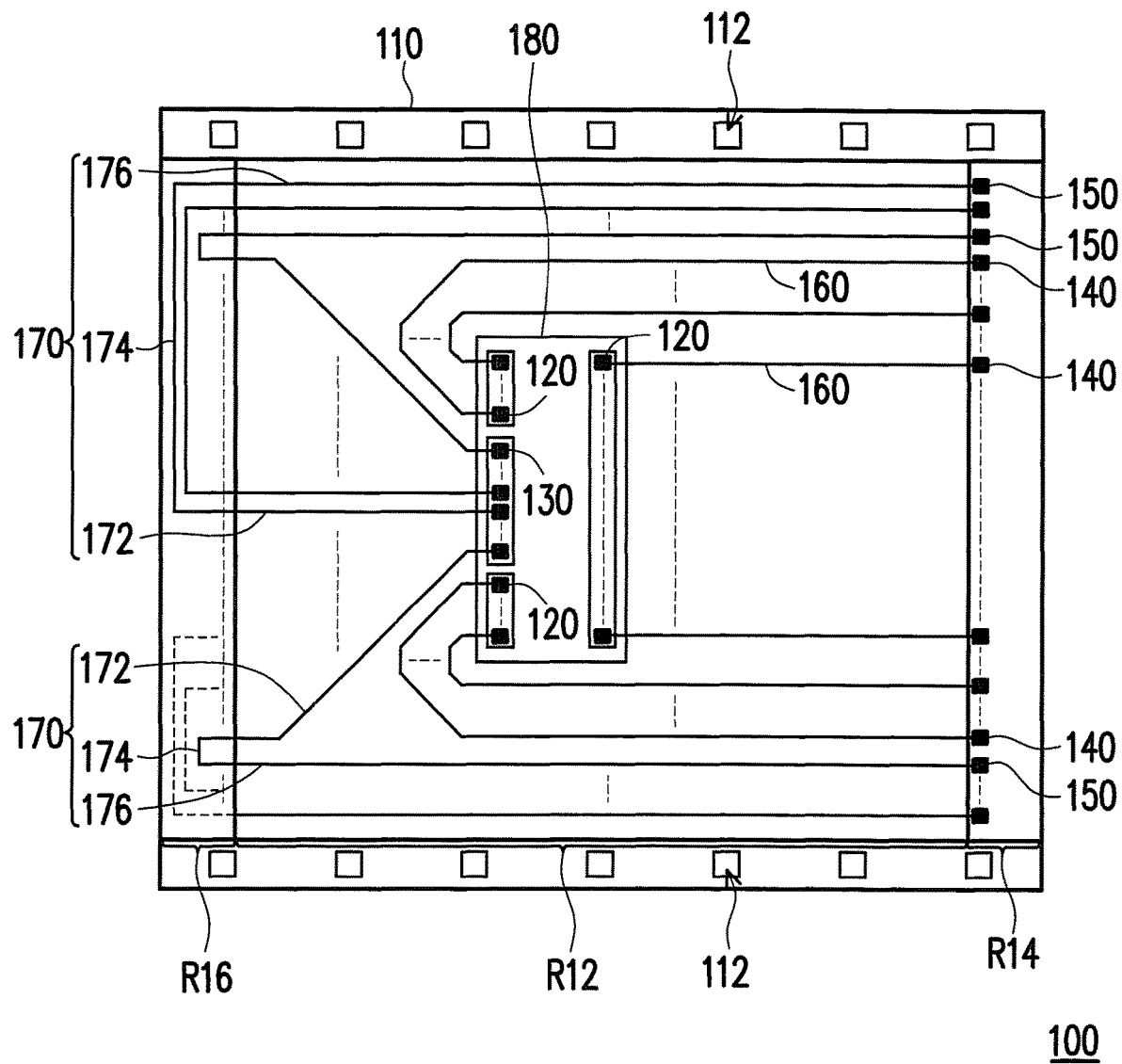
FIG. 1 is a schematic top view of a chip-on-film package according to one embodiment of the invention.

FIG. 1 is a schematic top view of a chip-on-film package according to one embodiment of the invention. Referring to FIG. 1, a chip-on-film package 100 of the present embodiment includes a flexible substrate 110, a plurality of first test pads 140, a plurality of second test pads 150, a plurality of first connecting wires 160, a plurality of second connecting wires 170, and a chip 180. The first test pads 140, the second test pads 150, the first connecting wires 160 and the second connecting wires 170 are disposed on the flexible substrate 110. The chip 180 comprises a plurality of first connecting pads 120 and a plurality of second connecting pads 130 for bonding the chip 180 to the flexible substrate 110. The first connecting pads 120 and the second connecting pads 130 are the bonding terminals on the chip 180 for bonding to the flexible substrate 110, and first connecting pads 120 and the second connecting pads 130 can be but not limited to bonding pads and/or bumps. In FIG. 1, only the location of the chip 180 is represented by the contour line of the chip 180, and connecting terminals under the chip 180 are also exposed for illustrating purpose. The flexible substrate 110 shown in FIG. 1 includes a central portion R12, a first side portion R14, and a second side portion R16. The first side portion R14 and the second side portion R16 are located at two opposite sides of the central portion R12 respectively, so that the first side portion R14 and the second side portion R16 are separated by the central portion R12 and not connected to each other. The chip 180 is disposed on the central portion R12 so that the first connecting pads 120 and the second connecting pads 130 are bonded to the central portion R12 of the flexible substrate 110. The first test pads 140 and the second test pads 150 are disposed on the first side portion R14. Two ends of each of the first connecting wires 160 are connected to the corresponding first connecting pad 120 and the corresponding first test pad 140. Two ends of each of the second connecting wires 170 are respectively connected to the corresponding second connecting pad 130 and the corresponding second test pad 150. Moreover, each of the second connecting wires 170 includes a first section 174 located at the second side portion R16. In one embodiment of the invention, the first side portion R14 is used for the test of the signal inputting function and the signal outputting function of the chip 180 in the production stage of the chip-on-film package 100, and therefore, after the test is completed, the first side portion R14 can be removed, and the second side portion R16 can also be removed. In other words, if the section located at the second side portion R16 of each of the second connecting wires 170 is removed, the remaining part of each of the second connecting wires 170 on the central portion R12 is divided into two sections independent from each other.

For convenience of explanation, only a single chip-on-film package is depicted in FIG. 1. In mass production, the structure of the chip-on-film package 100 in FIG. 1 can be considered as a unit in a reel-type chip-on-film packages. In above-mentioned circumstance, the chip-on-film package of the present embodiment can be considered as including: the flexible substrate 110 that can be divided into a plurality of segments, each of the segments includes the central portion R12, the first side portion R14, and the second side portion R16. In addition, in other embodiments of the invention, a chipset having multiple chips can be disposed on the central portion R12 such that the chipset can also be considered as the chip 180 in FIG. 1, and the first connecting pads 120, the second connecting pads 130, the first test pads 140, the second test pads 150, the first connecting wires 160, the second connecting wires 170 and the chip 180 (as multiple chips) have similar connection relationships as illustrated in FIG. 1.

In the conventional chip-on-film package and related testing process, two areas similar to the first side portion R14 and the second side portion R16 are the output/input signal test areas, hence, the probe cards of a test apparatus are controlled to contact both the two areas of the chip-on-film package for the testing process. When the length of the flexible substrate of the chip-on-film package is longer than the length of the probe area of the test apparatus, a new test apparatus may be needed to provide a larger probe area to accommodate the output/input signal test areas at two sides of the chip-on-film package with a longer flexible substrate so as to perform simultaneous test on the two test areas, which results in a great increasing of expenditure cost. Otherwise, the testing processes for the output/input signal test areas are separately performed since the probe area of an original test apparatus can accommodate only one of the two test areas, either for output signal test or for input signal test, of the chip-on-film package with a longer flexible substrate.

Thus, to use the original test apparatus spends more time to complete the testing process for the same number of longer chip-on-film packages than to use the new test apparatus having a larger probe area.

In contrast, according to the above description, in the chip-on-film package 100 of the present embodiment, the first test pads 140 and the second test pads 150 are all disposed at the first side portion R14. Therefore, when the chip 180 is tested, the probes (not shown) of the probe card of the test apparatus only needs contact with the test pads 140 and 150 located at the same first side portion R14. Because all the first test pads 140 and the second test pads 150 are located at the first side portion R14, the height differences between the test pads 140 and 150 are not so obvious although the flexible substrate 110 may be bended slightly, the probes of the probe card can easily and simultaneously contact with all of the test pads 140 and 150 so as to increase the yield rate of the testing process. In addition, if the length of the single segment (which has the tested chip or the tested chipset) of the flexible substrate 110 is longer than the length of the probe area of the test apparatus, the probe area of the test apparatus only needs accommodating the first side portion R14 where the test pads 140 and 150 are disposed to perform the test and the second side portion R16 is not necessarily accommodated, and therefore, there is no need to replace the test apparatus by a new test apparatus. Furthermore, in comparison between the chip-on-film package 100 of the present embodiment and the conventional technique, the circuit of the first side portion R14 and the second side portion R16 and the layout of the test pads 140 and 150 are changed, but the circuit of the central portion R12 are not changed, so that the design of the final COF package product is not changed.

Various modifications of the present embodiment are described below, but the invention is not limited thereto. In the present embodiment, the first connecting pads 120 of the chip 180 are output pads, and the second connecting pads 130 of the chip 180 are input pads. In the present embodiment, the number of the first connecting pads 120 is greater than the number of the second connecting pads 130, and therefore, the number of the second connecting wires 170 connected with the second connecting pads 130 are also few. It should be noted here, the present embodiment does not limit whether the number of the first connecting pads 120 is equal to the total number of the output pads of the chip 180, and does not limit whether the number of the second connecting pads 130 is equal to the total number of the input pads of the chip 180; the first connecting pads 120 and the second connecting pads 130 in FIG. 1 represent those input/output pads of the chip 180 that require corresponding test pads. If there are some output/input pads of the chip 180 that does not require to be tested then they are not depicted in FIG. 1. In addition, the output/input pads of the chip 180 can be for signal, power, or grounding. The relationships between the connecting pads of the chip 180 and the test pads are not necessarily to be one to one, for example, in other embodiments, a plurality of connecting pads are, firstly, connected to each other by the circuit disposed on the central portion R12 and then connected to the corresponding test pads via the first connecting wires 160 and the second connecting wires 170 shown in FIG. 1 or FIG. 2. In addition, if the flexible substrate 110 is a reel-type film, each of two sides of the flexible substrate 110 has a row of sprocket holes 112; the first side portion R14, the second side portion R16, and the central portion R12 all are located between two rows of the sprocket holes 112. When the reel-type film serves as the flexible substrate 110, it is convenient to perform bonding the chip 180 and testing the chip-on-film package 100, so that the manufacturing time and cost can be significantly reduced. The sprocket holes 112 are used to move the flexible substrate 110 or the chip-on-film package 100 forward in the manufacturing process or test process.

Furthermore, each of the second connecting wires 170 of the present embodiment is formed by connecting sequentially a second section 172, a first section 174, and a third section 176. The second section 172 is located at the central portion R12 and connected to the second connecting pad 130, the third section 176 is located at the central portion R12 and connected to the second test pad 150, and the first section 174 is located at the second side portion R16 and connects the second section 172 with the third section 176. For example, the third section 176 can be pass lines reserved for the display panel maker for future use, e.g., to connect external elements, or the third section 176 may only be used during the test. Because the second section 172 and the third section 176 are connected by the first section 174, the second section 172 and the third section 176 can be simultaneously tested via the second test pad 150 to find out whether the second section 172 and the third section 176 have defect. Otherwise, two adjacent second connecting wires 170 can also be simultaneously and respectively inputted with high and low potential voltages, so as to test whether the signal loss problem occurs between two the third sections 176 of the two adjacent second connecting wires 170. Furthermore, there are no test pads disposed on the first sections 174 located at the second side portion R16 because the second test pads 150 corresponding to the second connecting pads 130 are disposed at the first side portion R14.

In the embodiment shown in FIG. 1, when the third sections 176 of the second connecting wires 170 are reserved for being used in the external system (e.g., pass lines), the number of the third sections 176 may be predetermined number. Under the circumstance that the number of the input pads which needs to be equipped with test pads in the chip is close to the number of the third sections 176, the second connecting pads 130 (input pads) are connected to the second test pads 150 via the second sections 172, the first sections 174 and the third sections 176 of the second connecting wires 170, which means that the third sections 176 reserved for the external system are effectively used in the testing stage and the complexity of circuit of the central portion R12 is not increased. The first connecting wires 160, and the second sections 172 of the connecting wires 170, are usually called leads.

Figure 2:
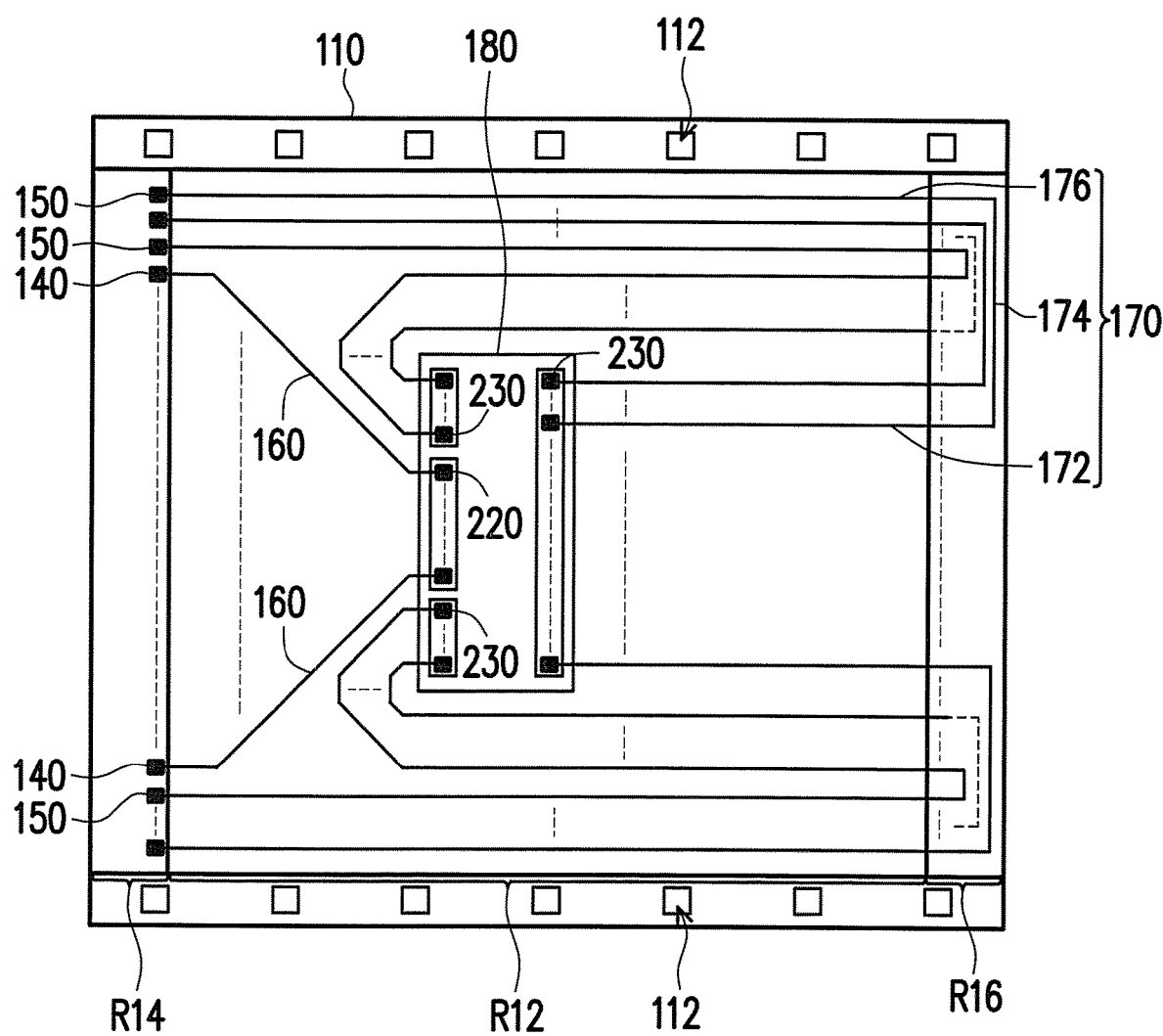
FIG. 2 is a schematic top view of a chip-on-film package according to another embodiment of the invention.

FIG. 2 is a schematic top view of a chip-on-film package according to another embodiment of the invention. Referring to FIG. 2, the chip-on-film package 200 of the present embodiment is similar to the chip-on-film package 100 in FIG. 1, only differences therebetween are explained here. In the present embodiment, the first connecting pads 220 are input pads, and the second connecting pads 230 are output pads. The second connecting pads 230 (output pads) of the embodiment in FIG. 2 are connected to the second test pads 150 via the first sections 174 and the third sections 176 of the second connecting wires 170, therefore, if the number of the output pads which needs to be equipped with test pads in the chip is close to the number of the third sections 176 as pass lines reserved for the external system, the third sections 176 are effectively used in the testing stage by using the embodiment in FIG. 2 and then the complexity of circuit of the central portion R12 is not increased. In other embodiments that are not shown, the first connecting pads and the second connecting pads can also be a mix of the input pads and the output pads. In other embodiments that are not shown are based on the structure in FIG. 2, when the number of output pads which needs to be equipped with test pads in the chip is greater than the number of the third sections 176 (as pass lines reserved for the external system), there are also some output pads connected to additional test pads disposed at the second side portion R16, other than the second connecting pads 230 (output pads) already connected to the test pads 150 at the first side portion R14.

Figure 3:
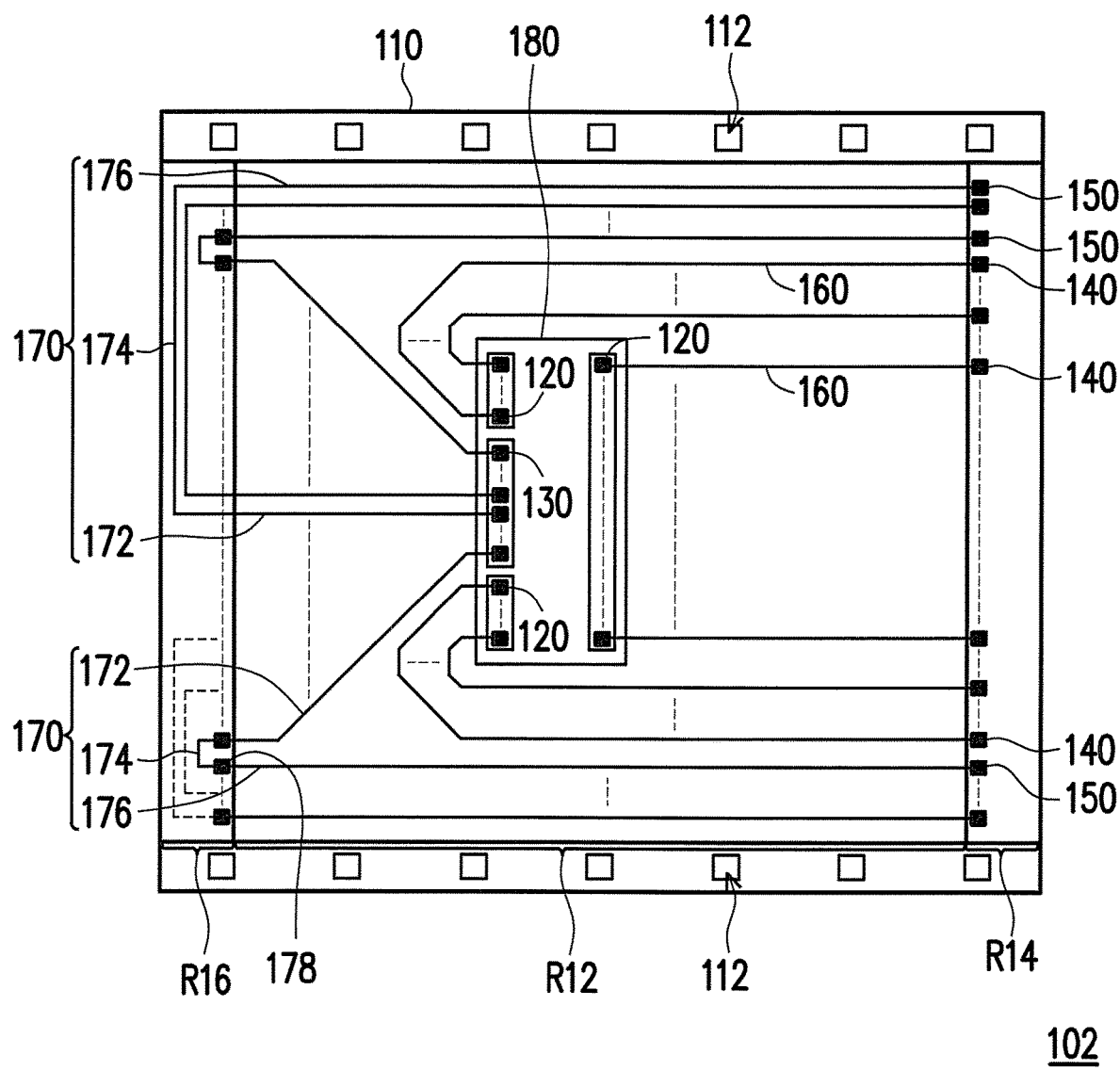
FIG. 3 is a schematic top view of a chip-on-film package according to another embodiment of the invention.

In addition, referring to FIG. 3, FIG. 3 is a schematic top view of a chip-on-film package according to another embodiment of the invention. The chip-on-film package 102 in FIG. 3 is similar to the chip-on-film packages in FIG. 1 and FIG. 2, the difference is that test pads 178 are disposed on the first sections 174 of the second connecting wire 170 located at the second side portion R16. The function of the test pads 178 at the second side portion R16 is the same as the function of the second test pads 150 located at the first side portion R14, so that the test position can be conveniently and flexibly selected. In other embodiments, test pads may be disposed or may not be disposed on the first section 174 of the second connecting wire 170.

Figure 6:
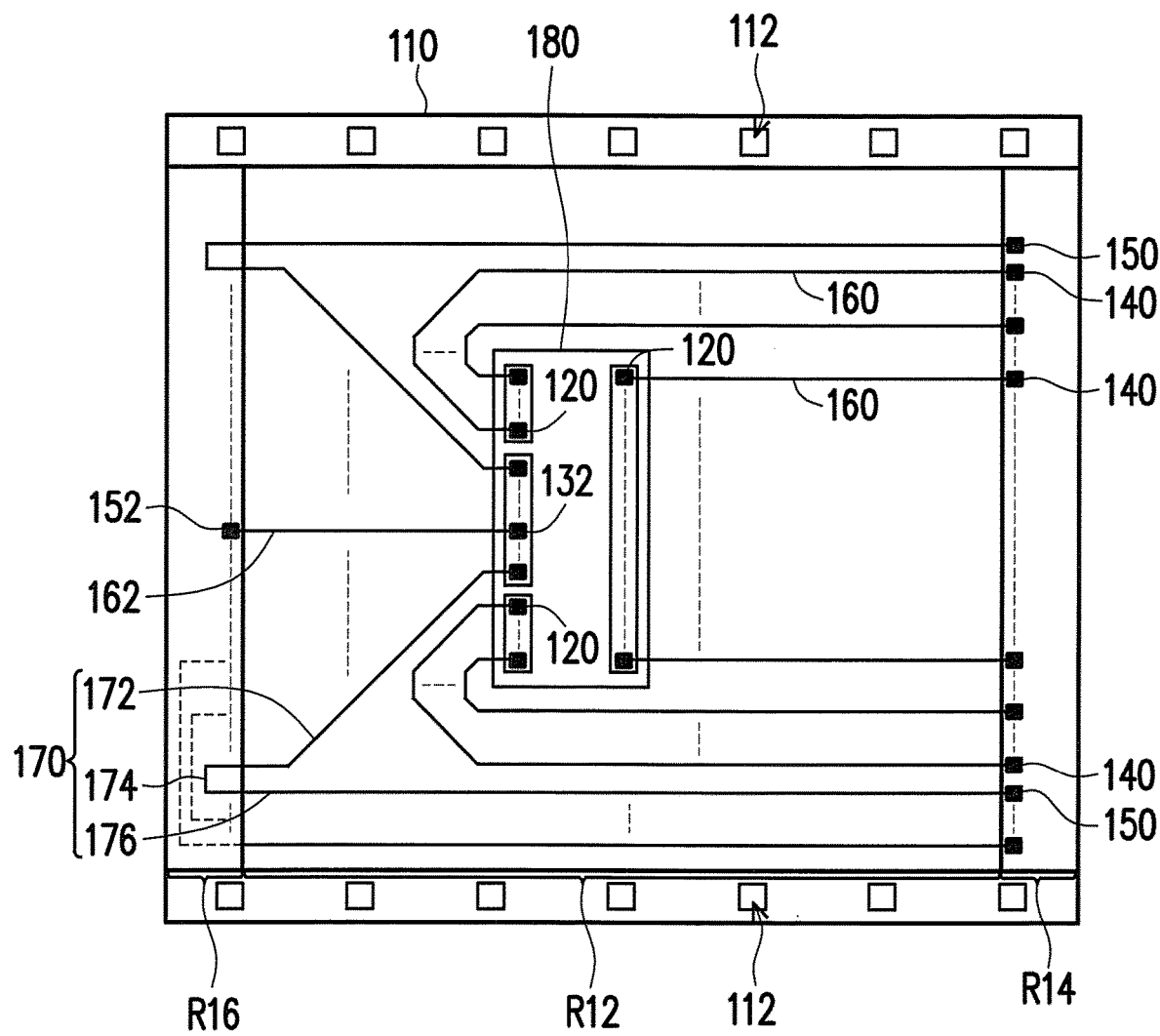
FIG. 6 is a schematic top view of a chip-on-film package according to another embodiment of the invention.

FIG. 6 is a schematic top view of a chip-on-film package according to another embodiment of the invention. Referring to FIG. 6 the chip-on film package 102 includes at least one third test pad 152 disposed at the second side portion R16, at least one third connecting wire 162, and includes other elements similar to FIG. 1 or FIG. 2. The third connecting wire 162 connects the corresponding third connecting pad 132 with the corresponding third test pad 152. The third connecting pad 132 can be an output pad or an input pad of the chip 180. In the present embodiment, although the test pads are not all disposed at the same side (the first side portion R14) but are disposed on both side portions, a plurality of second connecting pads are still connected to the corresponding second test pads at the first side portion R14 by the second connecting wires. In such as case, the original test apparatus may be replaced by a new test apparatus under the circumstance that the length of the segment of the chip-on-film package is longer than the length of the probe area of the test apparatus, however the third sections 176 reserved for the external system (e.g., pass lines) are effectively used in the testing stage by using the present embodiment and then the complexity of circuit of the central portion R12 is not increased.

Figure 4:
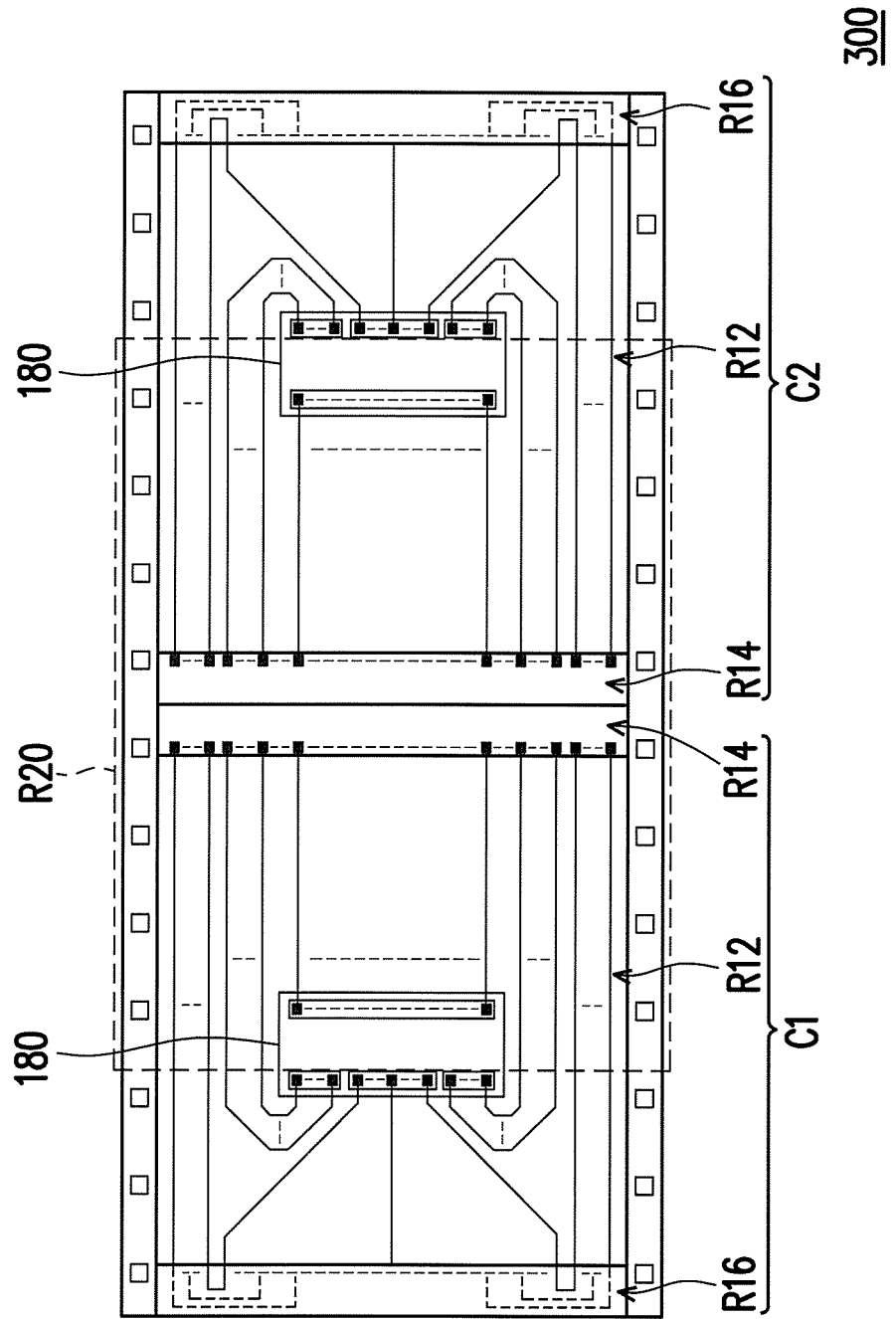
FIG. 4 is a schematic top view of relative relationship between a chip-on-film package and a probe area of a test apparatus according to another embodiment of the invention.

FIG. 4 is a schematic top view of relative relationship between a chip-on-film package and a probe area R20 of a test apparatus according to another embodiment of the invention.

Referring to FIG. 4, the chip-on-film package 300 of the present embodiment is similar to the chip-on-film package 100 in FIG. 1, only differences therebetween are explained here. The flexible substrate shown in FIG. 3 includes two adjacent segments C1 and C2, each of the segment C1 and the segment C2 is similar to the single segment shown in FIG. 1, the first side portion R14 of the segment C1 is adjacent to the first side portion R14 of the segment C2, the second side portion R16 of the segment C1 and the second side portion R16 of the segment C2 are located at another side of each central portion R12. In other words, the second side portion R16, the central portion R12, the first side portion R14, the first side portion R14, the central portion R12, and the second side portion R16 are sequentially arranged in the present embodiment. In other word, if taking the segments C1 and C2 as a tested unit which is tested simultaneously, the second side portions R16 of the two segments C1 and C2 are all located at the outermost sides of the tested unit. Because the two first side portions R14 are adjacent to each other, the probe area R20 of the test apparatus can easily accommodate the two first side portions R14. Therefore, two chips 180 are simultaneously tested, so as to save the processing time and cost.

Figure 5:
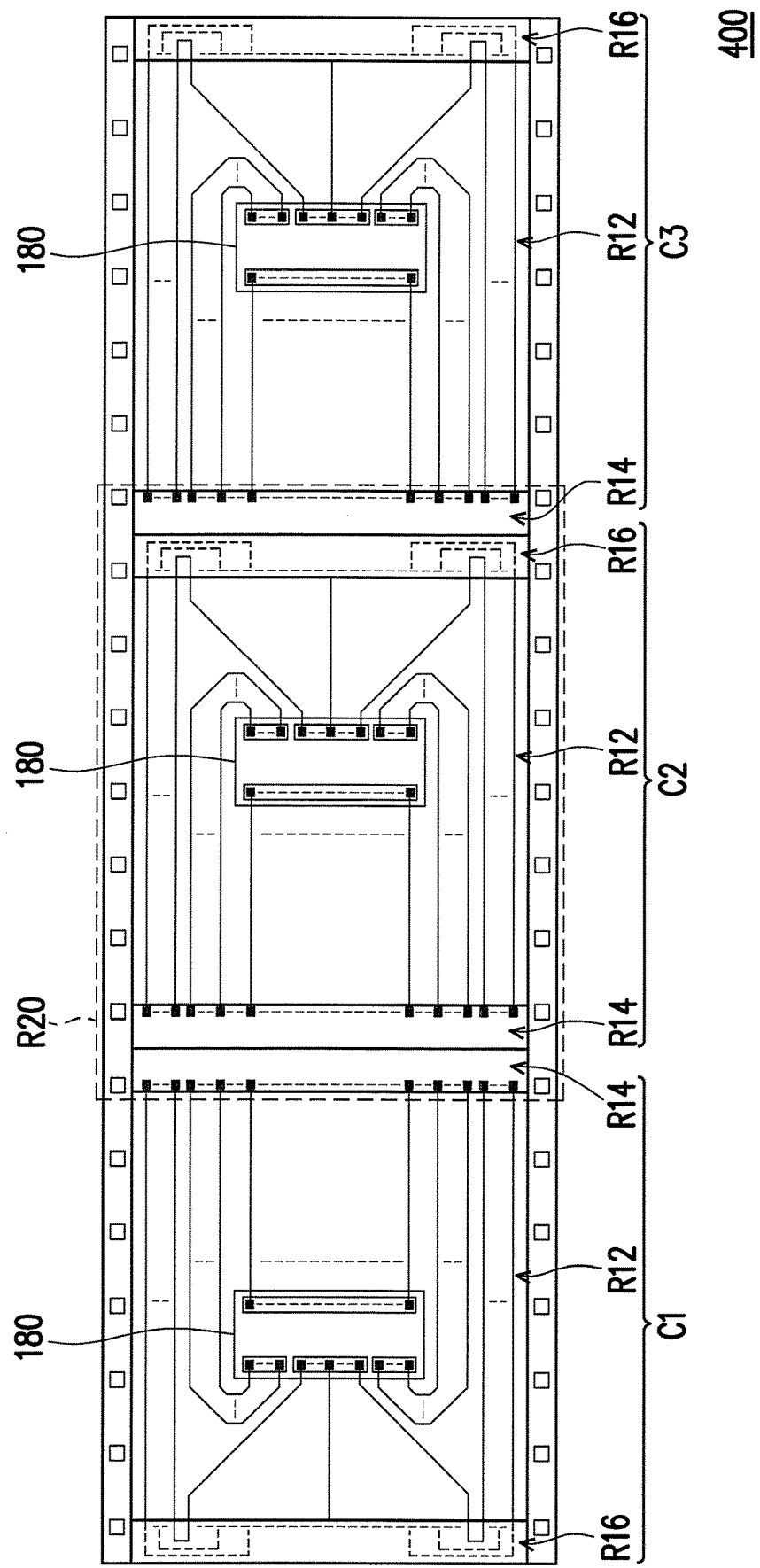
FIG. 5 is a schematic top view of relative relationship between a chip-on-film package and a probe area of a test apparatus according to another embodiment of the invention.

FIG. 5 is a schematic top view of relative relationship between a chip-on-film package and a probe area of a test apparatus according to another embodiment of the invention. Referring to FIG. 5, the chip-on-film package 400 of the present embodiment is similar to the chip-on-film package 300 in FIG. 4, only differences therebetween are explained here. The flexible substrate shown in FIG. 5 includes three segments C1, C2, and C3 arranged sequentially, each of the segment C1, the segment C2, and the segment C3 is similar to the single segment shown in FIG. 1, the segment C2 is located at the middle, the segments C1 and C3 are located at two opposite sides of the segment C2; with respect to the segment C1, the first side portion R14 of the segment C1 is adjacent to the first side portion R14 of the segment C2, and the second side portion R16 of the segment C1 is located at another side of the central portion R12; with respect to the segment C3, the first side portion R14 of the segment C3 is adjacent to the second side portion R16 of the segment C2, the second side portion R16 of the segment C3 is located at another side of the central portion R12. In other word, if taking these three segments C1, C2 and C3 as a tested unit segment which is tested simultaneously, the second side portions R16 of the segments C1 and C3 are located at the outermost sides of the tested unit. Because two first side portions R14 are adjacent to each other and also very close to another first side portion R14, even if the size of the probe area R20 of the test apparatus is maintained to be the same size as when testing two chip-on-film package (e.g., probe area R20 in FIG. 4 and in FIG. 5 are similar), the test apparatus can easily accommodate the first side portions R14 where test pads are disposed corresponding to three segments so that three chips 180 are simultaneously tested, so as to further save the processing time and cost. It should be noted here, the main purpose of arranging segments as shown in FIG. 5 is arranging the test pad areas (the three first side portions R14) corresponding to three chips 180 as close as possible to be accommodated in the probe area of the test apparatus; in other embodiments, the locations of the first side portion R14 and the second side portion R16 of the middle segment C2 may be interchanged and the same effect still can be achieved.

In summary, all test pads of the chip-on-film package of the invention are located at the same side portion, therefore, all test pads of at least two chip-on-film packages are simultaneously accommodated in the limited probe area of the test apparatus, so as to increase the number of chip-on-film packages which are simultaneously tested, to shorten processing time, and to reduce the processing cost. In addition, the yield rate of test is easily increased.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:
1. A chip-on-film package, comprising:
   a flexible substrate, comprising at least one segment, wherein the at least one segment comprises a central portion, a first side portion, and a second side portion, and the first side portion and the second side portion are located at two opposite sides of the central portion respectively;
   a chip, disposed on the central portion, comprising a first side close to the first side portion and a second side close to the second side portion, and comprising a plurality of first connecting pads and a plurality of second connecting pads for bonding to the flexible substrate, wherein the first connecting pads and the second connecting pads are disposed along the second side of the chip;
   a plurality of first test pads and a plurality of second test pads, disposed on the first side portion;
   a plurality of first connecting wires, wherein two ends of each of the first connecting wires are respectively connected to the corresponding first connecting pad and the corresponding first test pad;
   a plurality of second connecting wires, wherein each of the second connecting wires comprises a first section, a second section and a third section, wherein the first section is located at the second side portion, the second section is located at the central portion and connects the corresponding second connecting pad and one end of the first section,
   the third section is located at the central portion and connects to the other end of the first section and the corresponding second test pad, and two ends of each of the second connecting wires are respectively connected to the corresponding second connecting pad and the corresponding second test pad, and
   wherein each of the plurality of first connecting pads is connected to one of the plurality of first test pads on the first side portion, and each of the plurality of second connecting pads is connected to one of the plurality of second test pads on the first side portion.

2. The chip-on-film package as recited in claim 1, wherein the first connecting pads are output pads, the second connecting pads are input pads.

3. The chip-on-film package as recited in claim 1, wherein the first connecting pads are input pads, the second connecting pads are output pads.

4. The chip-on-film package as recited in claim 1, wherein the number of the first connecting pads are greater than the number of the second connecting pads.

5. The chip-on-film package as recited in claim 1, wherein the flexible substrate is a film, each of two sides of the flexible substrate has a row of sprocket holes, and the central portion, the first side portion, and the second side portion are located between two rows of the sprocket holes.

6. The chip-on-film package as recited in claim 1, wherein when the number of the at least one segment are greater than or equal to 2, the first side portions of two adjacent segments are adjacent to each other, and each of the second side portions of the two adjacent segments are respectively located at another side of each of the central portions of the two adjacent segments.

7. The chip-on-film package as recited in claim 1, wherein when the number of the at least one segment are greater than or equal to 3, the first side portions of two segments that are located at outer sides of three successive segments are adjacent to a segment located at middle of the three successive segments, and each of the second side portions of the two outer segments are respectively located at another side of each of the central portions of the two outer segments.

8. The chip-on-film package as recited in claim 1, further comprising at least one third test pad disposed at the second side portion and located on the first section of at least one corresponding second connecting wire of the second connecting wires.

9. The chip-on-film package as recited in claim 1, further comprising:
- at least one third test pad, disposed at the second side portion; and
- at least one third connecting wire, wherein the chip further comprises at least one third connecting pad for bonding to the flexible substrate, and the at least one third connecting wire connects the at least one third connecting pad with the at least one third test pad.

* * * * *